(12) United States Patent
Fourtet et al.

(10) Patent No.: US 6,345,173 B1
(45) Date of Patent: Feb. 5, 2002

(54) FREQUENCY MODULATOR

(75) Inventors: Christophe Fourtet, Pompigan; Jacques Trichet, Rousseau, both of (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/297,847

(22) PCT Filed: Nov. 5, 1997

(86) PCT No.: PCT/EP97/06127

§ 371 Date: May 6, 1999

§ 102(e) Date: May 6, 1999

(87) PCT Pub. No.: WO98/20607

PCT Pub. Date: May 14, 1998

(30) Foreign Application Priority Data

Nov. 6, 1996 (FR) .............................................. 96 13509

(51) Int. Cl.[7] .................................................. H04B 1/40
(52) U.S. Cl. ........................ 455/76; 455/113; 455/119; 331/23; 332/128; 375/327
(58) Field of Search .............................. 455/75, 76, 113, 455/119; 332/128; 331/2, 23, 25; 375/327

(56) References Cited

U.S. PATENT DOCUMENTS 5,734,302 A * 3/1998 Teng et al. .................. 332/128

* cited by examiner

*Primary Examiner*—Lee Nguyen
(74) *Attorney, Agent, or Firm*—Sarah J. Gibson; Rennie William Dover (57) ABSTRACT

A frequency modulator (50, 150) for modulating a carrier signal according to a modulation data signal to provide a modulated output signal (RFout), comprises a reference signal generator (54, 154) coupled to receive the modulation data signal for performing a low frequency modulation process and for generating a reference signal modulated according to the modulation data signal, and a main synthesizer (52, 152) coupled to receive the modulated reference signal and the modulation data signal for performing a high frequency modulation process and for providing the modulated output signal at an output. Preferably, the modulated reference signal has a first modulation gain (Kr) and the modulated output signal has a modulation gain (KV) which is substantially proportional to the first modulation gain (Kr).

21 Claims, 6 Drawing Sheets

FREQUENCY MODULATOR

FIELD OF THE INVENTION

This invention relates to a frequency modulator and a transmitter and transceiver incorporating a frequency modulator for a digital radio communication device.

BACKGROUND OF THE INVENTION

Many digital radio communication systems, such as cellular, cordless and data transmission systems, use FSK, GFSK or GMSK modulation techniques. These types of modulation techniques are in fact simply frequency modulation (FM) with the radio frequency (RF) signal envelope constant.

Since there is no amplitude modulation (AM) involved in these types of modulation, the voltage controlled oscillator (VCO) frequency of the transmitters can be directly modulated by the baseband signal, as is typical in regular analog FM transmitters, such as in analog cellular systems. Significant cost reductions can be obtained by directly modulating the VCO frequency so that such arrangements are particularly desirable in digital applications where low cost is a strategic factor. For example, the overall cost of a digital solution such as DECT must be very low to be competitive with well known analog systems such as CT0.

For analog systems, the voice spectrum, 300 to 3000 Hz or more, is compatible with the lock-up time of the PLL synthesizer when the modulation is applied to the VCO. The lock-up time is generally never less than 5 or 6 ms. However, when applying this low cost technique in digital systems, the baseband signal, which modulates the VCO, is the filtered No-Return-to-Zero (NRZ) data stream coming from the logic section of the transmitter device. This baseband signal has a very low frequency content in its spectrum (from a few Hz). Since the required lock-up time for the PLL synthesizer is around few microseconds, it is not compatible with the spectrum of the baseband signal. The low frequencies of the modulation are considered like VCO drifts and so are corrected by the PLL loop. This incompatibility problem means that either the low frequency content of the baseband signal is lost or the speed of the PLL loop, which determines the speed for channel selection, is compromised.

Thus, before this low cost technique can be advantageously applied in digital systems, the problem of ensuring compatibility with the PLL synthesizer lock-up time needs to be resolved and further requirements have to be considered.

For example, in order to avoid any inter symbol interferences which could corrupt the eyes pattern and degrade the Bit Error Rate of the transmission in the digital system, the group delay on the modulation path has to be kept constant in all the spectrum of the baseband signal.

Furthermore, in order to meet the applicable radio specifications, the spectral purity of the RF signal source to be transmitted should be maintained as near the carrier signal as possible for phase noise and modulation accuracy, and as far from the carrier signal as possible for harmonics, noise floor, discrete spurious signals. Should this last requirement be sufficiently met, filters and duplexers would no longer be needed which would provide a drastic reduction in cost of the transmitter. Being able to reduce the filters and duplexers is significant in keeping the overall cost of the digital system down which improves the competitiveness of the digital solution compared to the analog solution.

Several modulation techniques which modulate the VCO in a digital system are known.

For example an I/Q modulator has been used in a direct or heterodyne architecture. This type of modulator is driven by two RF signals in quadrature coming from an external oscillator which is tuned on the transmitted frequency (direct architecture) or on an intermediate frequency (heterodyne architecture) and by two complex baseband signals, calculated from the data stream (I and Q signals). With such architectures, the RF oscillator(s) or synthesizer(s) are independent of the modulation process so that the lock-up time can be chosen independently from the baseband signal spectrum. However, such architectures are complex and require an expensive 'I/Q' interface in the baseband which can be justified for very accurate GMSK systems, like GSM, but not in standards like DECT or CT2, where the modulation index can vary by large amounts and where cost is strategic. A further disadvantage with these techniques it that they are noisy and so do not allow for the filters and duplexers to be removed.

A different but well known technique uses a heterodyne arrangement with a fixed modulated local oscillator. A channel synthesizer which meets the lock-up time requirements is mixed with a crystal oscillator or a very slow synthesizer able to handle the modulation. This type of arrangement is very efficient and robust and allows zero blind slots because the channel synthesizer is fast enough. In other words, with this type of arrangement every slot can be used. However, it always generates many mixing products out of the bandwidth of the signal to be transmitted, which have to be strongly filtered, increasing the cost of the transmit path.

Another technique called the 'open loop' technique has been used with cordless standards such as DECT or CT2. As mentioned above, a problem with applying the modulation to the VCO is that the low frequency part of the FM modulation will be corrected by the loop of the synthesizer as it does for frequency drift of the VCO. In order to avoid this, the open loop technique opens the loop during a transmission slot so that the VCO is working in a free-run mode without any feedback and can be modulated without any correction from the loop. After the transmission slot, the loop is closed again and the VCO resynchronized. Resynchronization is however difficult to achieve. In fact, it is so difficult to achieve, that the VCO must typically work at half the final frequency and must be followed by a frequency doubler to be properly buffered against transients and frequency drifts. This requires many filters which increases the overall cost of the transmitter device. A further disadvantage of the open loop technique is that it does not allow for zero blind slots because of the frequency drift due to the free-run mode.

In addition, the phase detector of the synthesizer for the open loop technique is very hard to design because of the low leakage current required.

In fact, the open loop technique cannot be used in 'high-end' standards, such as GSM or MOBITEX, where parasitic drifts due to the free-run mode periods are not allowed by the respective specifications. The open loop technique can be implemented for standards such as DECT and CT2, but due to its difficult resynchronisation, only half of the available slots can be used. This is a problem for public base stations or for range improvement.

There is therefore a need to provide an improved low cost frequency modulator for a digital radio communication device which overcomes the above described problems.

SUMMARY OF THE INVENTION

In accordance with the present invention there is provided a frequency modulator for modulating a carrier signal according to a modulation data signal to provide a modulated output signal, the frequency modulator comprising:

a reference signal generator coupled to receive the modulation data signal for generating a reference signal modulated according to the modulation data signal; and a main synthesizer coupled to receive the modulated reference signal and the modulation data signal for providing the modulated output signal at an output, and wherein the reference signal generator comprises an auxiliary synthesizer having a lock-up time which is substantially greater than that of the main synthesizer, the auxiliary synthesizer comprising:

an auxiliary phase detector having a first input for receiving a fixed reference signal having a fixed frequency, a second input and an output for providing an error signal representing the difference in phase between the fixed reference signal and a signal at the second input; and an auxiliary VCO coupled to receive the error signal and the modulation data signal for generating the modulated reference signal at an output, the output of the auxiliary VCO being coupled to the main synthesizer and to the second input of the auxiliary phase detector.

Thus, by modulating the reference signal supplied to the main synthesizer with the modulation data signal and by applying the modulation data signal to the main synthesizer, the present invention ensures that the modulation process to provide the modulated output signal is independent of the speed of the main synthesizer. This means that the low frequency components of the modulation data signal are not lost nor is the speed of the main synthesizer compromised.

Preferably, the modulated reference signal has a first modulation gain and the modulated output signal has a modulation gain which is substantially proportional to the first modulation gain. This results in the modulated output signal RFout having a response which is flat in amplitude and group delay, and independent of modulating frequency.

In a preferred arrangement, the main synthesizer for generating the modulated output signal and for controlling the frequency of the carrier signal, comprises:

a phase detector having a first input for receiving the modulated reference signal, a second input and an output for providing an error signal representing the difference in phase between the modulated reference signal and a signal at the second input;

a VCO coupled to receive the error signal and the modulation data signal for generating the modulated output signal at an output of the VCO; and a variable divider coupled between the output of the VCO and the second input of the phase detector for dividing the modulated output signal by a selectable value so as to vary the frequency of the carrier signal. With such an arrangement, the first modulation gain is preferably arranged to be substantially equal to the gain of the modulated output signal divided by the selectable value of the variable divider.

BRIEF DESCRIPTION OF THE DRAWINGS

Two frequency modulators in accordance with the present invention, a transceiver and a transmitter, both incorporating frequency modulators in accordance with the invention, will now be described, by way of example only, with reference to the accompanying drawings in which.

DETAILED DESCRIPTION OF THE DRAWINGS

Figure 1:
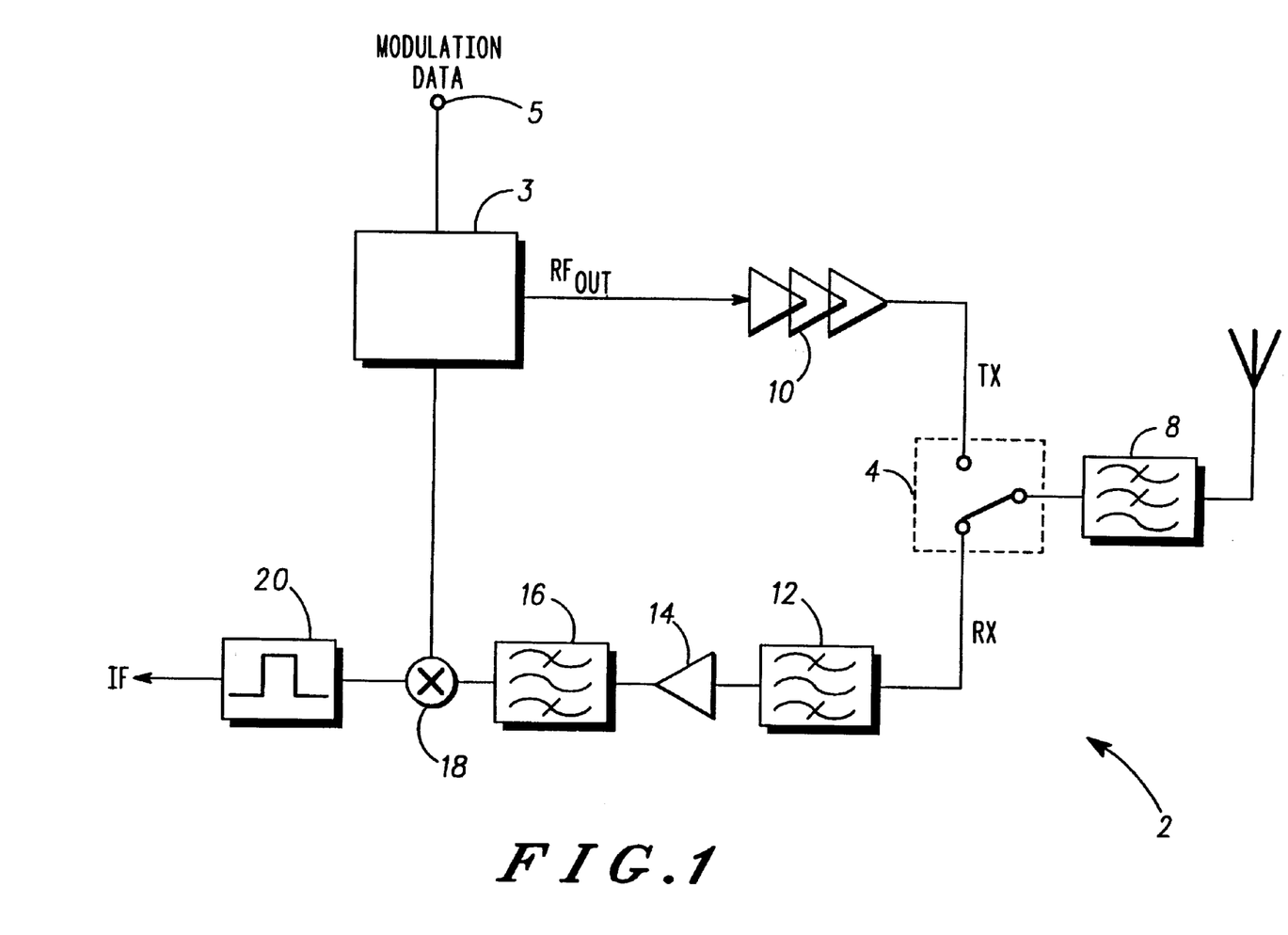
FIG. 1 is a block schematic diagram of a transceiver incorporating a frequency modulator in accordance with the present invention.

Referring firstly to FIG. 1, part 2 of a transceiver device incorporating a frequency modulator 3 in accordance with the present invention is shown comprising a transmit path TX and a receive path RX coupled via a switch 4 and a low-pass filter 8 to an antenna 6.

The frequency modulator 3 has an input 5 for receiving a modulation data signal which is generated from a data stream using a modulation technique, such as FSK, GFSK or GMSK, as is well known in the art. The data stream may include voice information. For GMSK modulation, the modulation data signal or baseband signal is an analog voltage generated by a GMSK analog filter (not shown). The frequency modulator 3 generates a carrier signal having a selectable frequency and modulates the carrier signal using the modulation data signal to provide a modulated output signal RFout at an output. The modulated output signal RFout is then amplified by the RF power amplifier 10 before being coupled to the antenna 6. The structure and function of the frequency modulator 3 will be described in more detail below.

The receive path RX includes a first bandpass filter 12, a low noise amplifier (LNA) 14, a second bandpass filter 16, a mixer 18 and an IF filter 20. The mixer 18 mixes the RF signal received at the antenna 6 with a reference signal which may be generated by a local oscillator (not shown) or by the frequency modulator 3 as shown in FIG. 1 so as to produce an intermediate frequency signal IF. Using the signal generated by the frequency modulator 3 avoids the need for an additional local oscillator.

Although the frequency modulator 3 in accordance with the present invention has been shown in FIG. 1 as part of a transceiver, it will be appreciated that the frequency modulator 3 in accordance with the present invention may be used in a transmitter.

Figure 2:
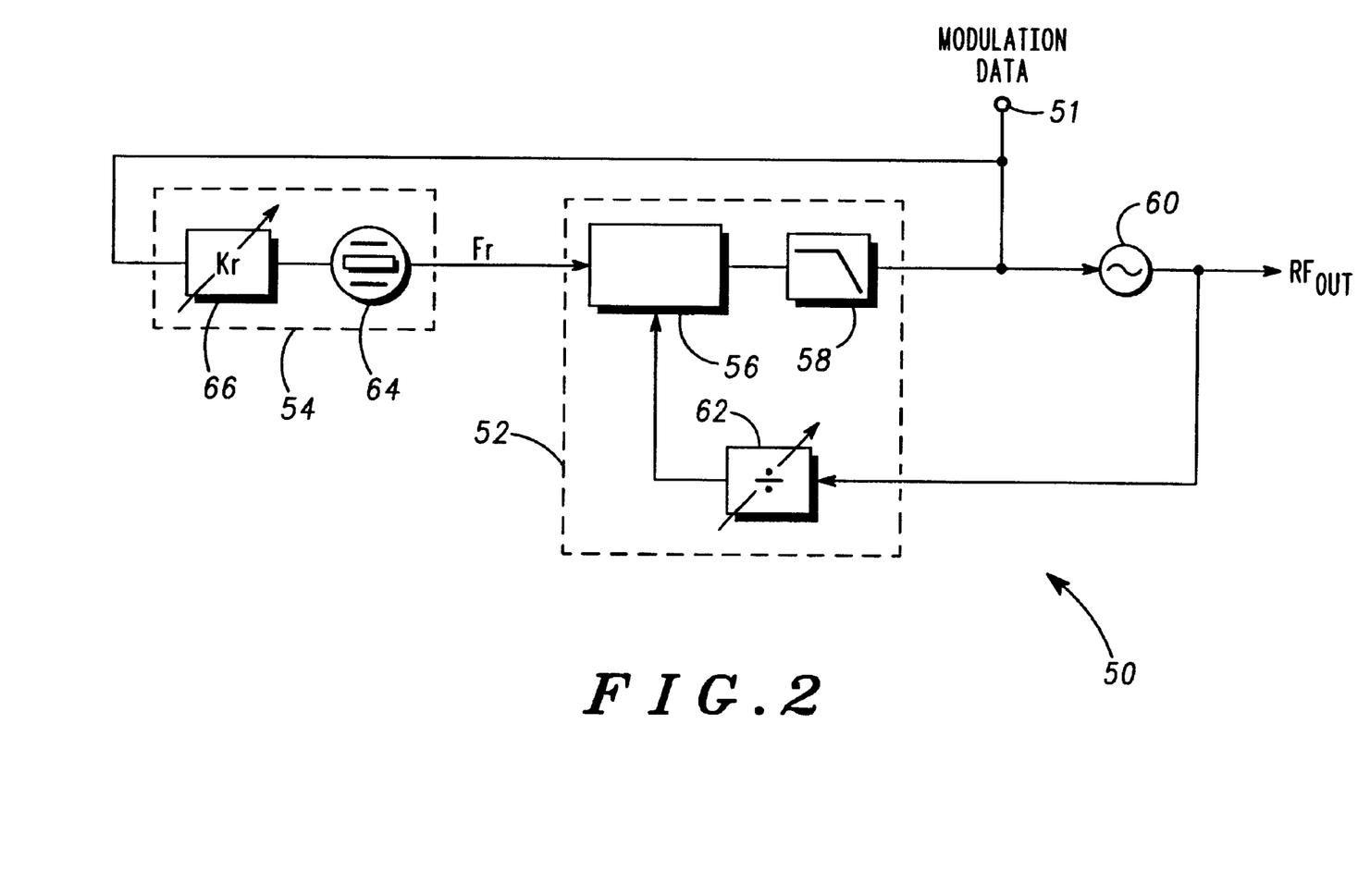
FIG. 2 is a block schematic diagram of a frequency modulator.

Referring now firstly to FIG. 2, a frequency modulator 50 comprises a main synthesizer 52 and a reference signal generator 54. The modulation data signal received at an input 51 of the frequency modulator 50 is coupled to the main synthesizer 52 and the reference signal generator 54. The main synthesizer 52 provides at an output the modulated output signal RFout and the reference signal generator 54 generates a modulated reference signal Fr which is supplied to the main synthesizer 52.

The reference signal generator 54 comprises a crystal oscillator 64 and a variable gain control 66. The modulation data signal is applied directly to the crystal oscillator so as to provide the modulated reference signal Fr. The variable gain control 66 is set so that the modulated reference signal Fr has a first modulation gain Kr.

The main synthesizer 52 comprises a phase detector 56, a loop filter 58, voltage controlled oscillator (VCO) 60 and a variable divider 62 arranged in a typical phase-locked loop (PLL) arrangement. The variable divider 62 divides the modulated output signal RFout at an output of the VCO 60 by a selectable value n so as to provide a divided modulated output signal. The selectable value n determines the frequency of the carrier signal which is generated by the VCO 60. In other words, the variable divider 62 is the channel selector of the main synthesizer 52.

The phase detector 56 has a first input for receiving the modulated reference signal Fr, a second input for receiving the divided modulated output signal and an output for providing an error signal representing the difference in phase between the modulated reference signal and the divided modulated output signal. The error signal is then filtered by the loop filter 58 before being applied to the VCO 60.

The filtered error signal, which is a voltage signal, is applied directly to the VCO 60 so as to generate a carrier signal whose frequency depends on the filtered error signal.

A disadvantage of such a frequency modulator 50 is that the crystal oscillator 64 itself is modulated and so cannot be used for other parts of the transceiver device. A device incorporating the frequency modulator 50 would therefore require additional crystal oscillators which would increase the cost of such a device. A further disadvantage of the frequency modulator 50 is that for wideband modulation (i.e. high data rates), the technique of modulating the crystal oscillator cannot be used.

Figure 3:
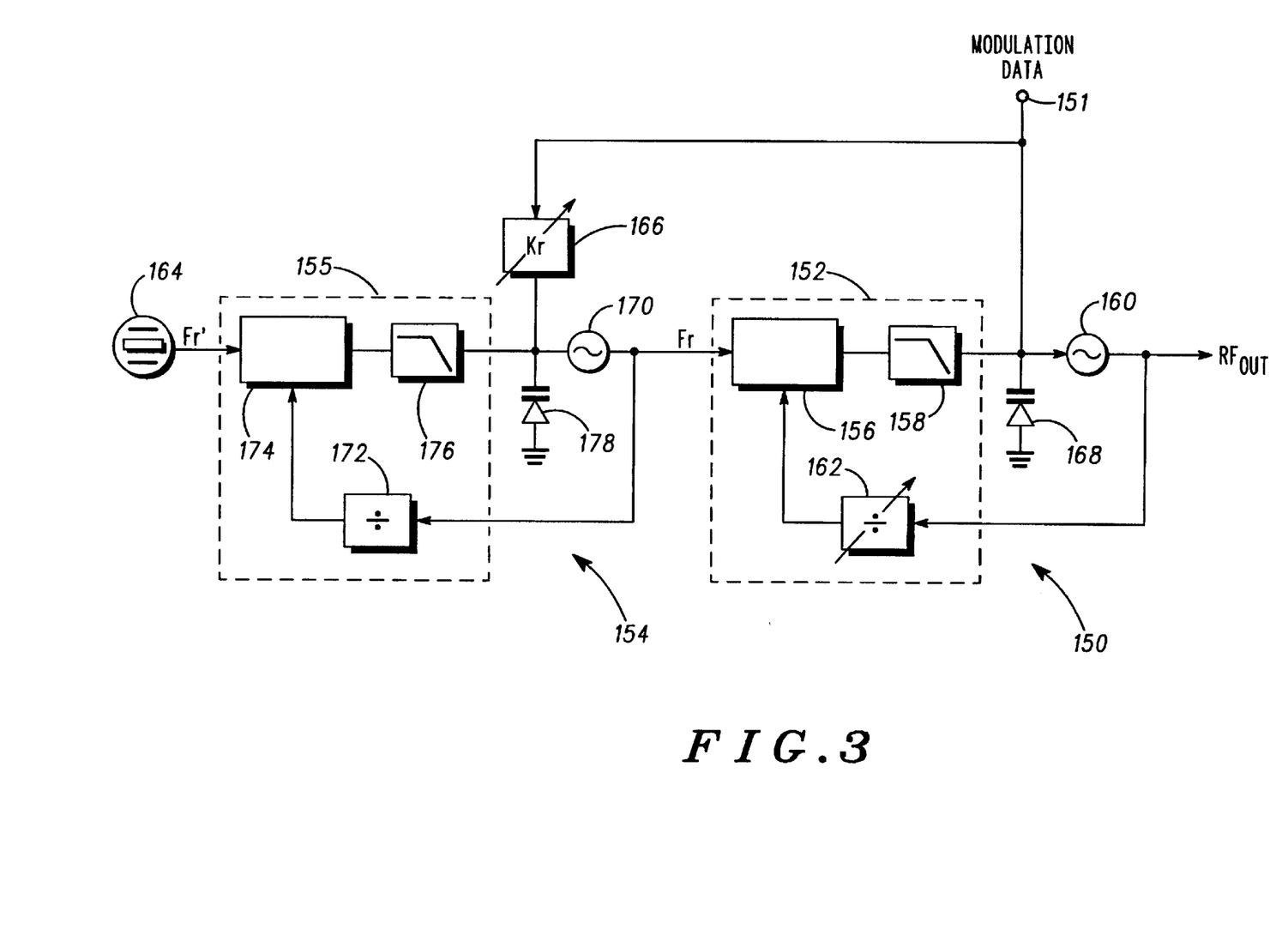
FIG. 3 is a block schematic diagram of a first frequency modulator in accordance with the present invention.

Referring now to FIG. 3, a first frequency modulator 150 in accordance with a first embodiment of the present invention comprises a main synthesizer 152 and a reference signal generator 154. The modulation data signal received at an input 151 of the frequency modulator 150 is coupled to the main synthesizer 152 and the reference signal generator 154. The main synthesizer 152 provides at an output the modulated output signal RFout and the reference signal generator 154 generates a modulated reference signal Fr which is supplied to the main synthesizer 152.

The reference signal generator 154 comprises an auxiliary synthesizer 155 coupled to a crystal oscillator 164 and to receive the modulation data signal at the input 151 such that the modulation data signal modulates an auxiliary VCO 170 of the auxiliary synthesizer 155. The output of the auxiliary VCO 170 provides the modulated reference signal to the main synthesizer 152.

The main synthesizer 152 comprises a phase detector 156, a loop filter 158, voltage controlled oscillator (VCO) 160 and a variable divider 162 arranged in a typical phase-locked loop (PLL) arrangement. The variable divider 162 divides the modulated output signal RFout at an output of the VCO 160 by a selectable value n so as to provide a divided modulated output signal. The selectable value n determines the frequency of the carrier signal which is generated by the VCO 160. In other words, the variable divider 162 is the channel selector of the main synthesizer 152.

The phase detector 156 has a first input for receiving the modulated reference signal Fr, a second input for receiving the divided modulated output signal and an output for providing an error signal representing the difference in phase between the modulated reference signal and the divided modulated output signal. The error signal is then filtered by the loop filter 58 before being applied to the VCO 160.

Normally, the filtered error signal, which is a voltage signal, is applied directly to the VCO 160 so as to generate a carrier signal whose frequency depends on the filtered error signal. However, in the preferred embodiment, the modulation data signal, in addition to the filtered error signal, is applied to the VCO 160, for example by combining the modulation data signal, which as mentioned above is an analog baseband voltage, with the filtered error signal, such that the analog baseband voltage and the error voltage determines the output of the VCO 160.

In order to apply the filtered error signal and the modulation data signal to the VCO 160, the VCO may have two control inputs or one control input. Preferably, the filtered error signal and the modulation data signal are combined by applying the modulation data signal to a modulation varicap diode of the VCO 160 and the filtered error signal to a tuning diode of the VCO 160. In a further embodiment, both the modulation data signal and the filtered error signal may be applied to the tuning varicap diode, such as diode 168.

By modulating the VCO 170 rather than the crystal oscillator, the first embodiment has an advantage in that the reference frequency signal Fr' generated by the crystal oscillator 164 can be re-used for different purposes within the transceiver. This is not possible with the frequency modulator 50 since the crystal reference is modulated directly. Moreover, in same applications, particularly those where the modulation index is high such as in DECT systems, there can be problems in modulating the frequency of the crystal oscillator. Using an auxiliary synthesizer to make a copy of the signal from the crystal oscillator 164 avoids this problem.

The auxiliary synthesizer 154 comprises an auxiliary phase detector 174, an auxiliary loop filter 176, an auxiliary VCO 170 and a divider 172 arranged in a typical phase-locked loop (PLL) arrangement. The divider 172 divides the modulated reference signal Fr at an output of the auxiliary VCO 170 by a fixed value so as to provide a divided modulated reference signal.

The auxiliary phase detector 174 has a first input for receiving the reference signal Fr' generated by the crystal oscillator 164, a second input for receiving the divided modulated reference signal and an output for providing an error signal representing the difference in phase between the reference signal Fr' and the divided modulated reference signal. The error signal is then filtered by the auxiliary loop filter 176 before being applied to the auxiliary VCO 170 together with the modulation data signal. These signals are combined in similar manner to that described above for VCO 160. For example, the modulation data signal and filtered error signal are both applied to a tuning varicap diode 178 of the VCO 170. The modulation data signal is coupled to the auxiliary synthesizer 155 via a variable gain control 166 so that the VCO 170 is modulated with a first modulation gain Kr to provide the modulated reference signal Fr at the output of the VCO 170.

The modulation gain KV of the VCO 160 is preferably adjustable by having an attenuator (not shown) coupled between the input 151 of the second frequency modulator 150 and an input of the VCO.

Figure 4:
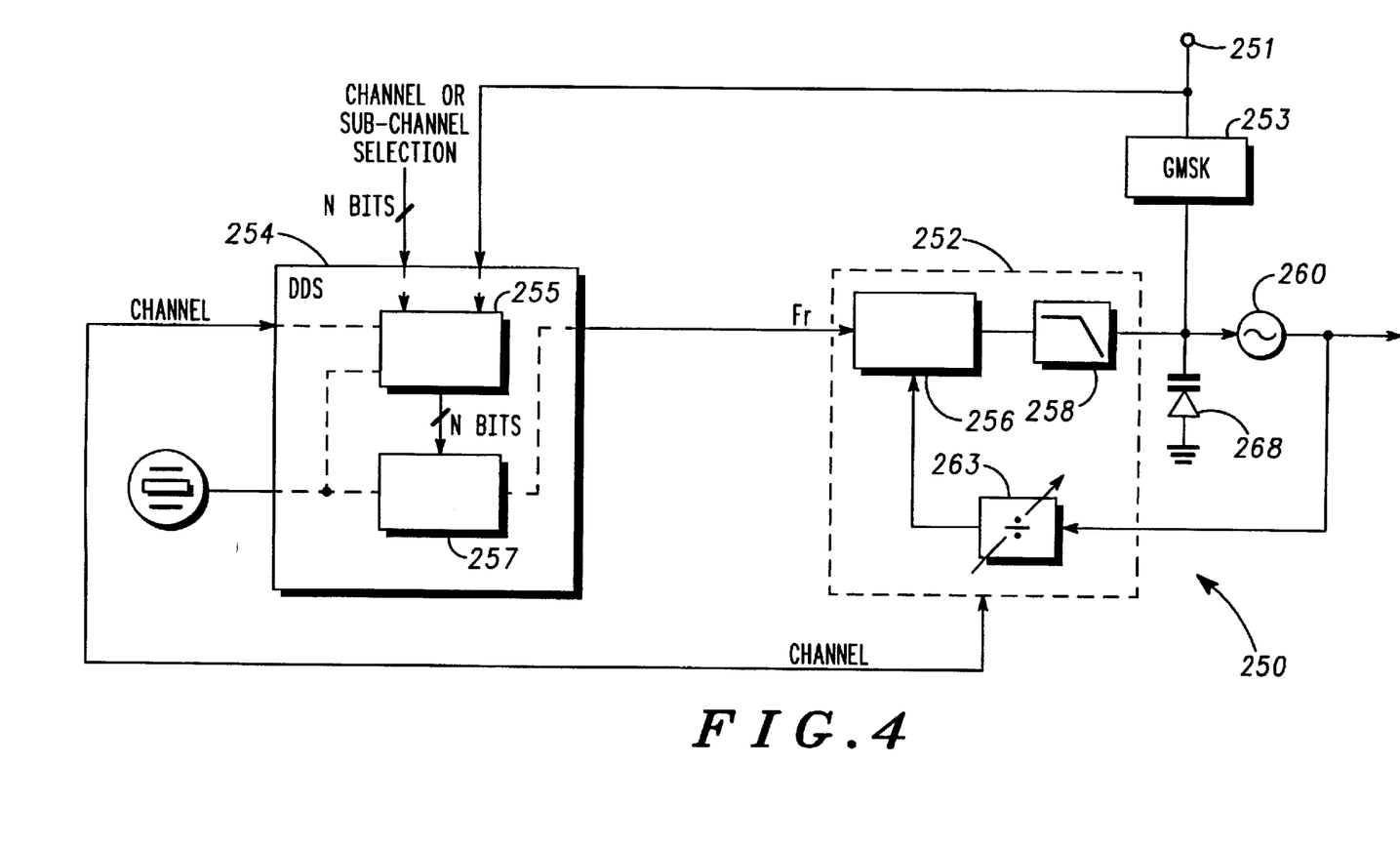
FIG. 4 is a block schematic diagram of a second frequency modulator in accordance with the present invention.

Referring now also to FIG. 4, a second frequency modulator 250 in accordance with a second embodiment of the present invention comprises a main synthesizer 252 and a reference signal generator 254. A data stream received at an input 251 of the second frequency modulator 250 is coupled to the main synthesizer 252 and the reference signal generator 254. In the embodiment shown in FIG. 4, GMSK modulation is used. The data stream received at input 251 is thus filtered in a GMSK analog filter 253 before being coupled to the main synthesizer 252 as a modulation data signal. The main synthesizer 252 provides at an output the modulated output signal RFout and the reference signal generator 254 generates a modulated reference signal Fr which is supplied to the main synthesizer 252.

The reference signal generator 254 in accordance with the second embodiment comprises a direct digital synthesizer (DDS), such as the AD9830 DDS supplied by Analog Devices. The DDS 254 has a digital input coupled directly to the data stream before filtering which allows for the reference frequency generated to be digitally modulated by the modulation data signal and an output for providing the modulated reference signal Fr to the main synthesizer 252. This modulation in the DDS 254 can be performed by an auxiliary look-up table 255, computing on N bits, for each clock period, the modulation trajectory, N giving the accuracy of the process (the greater is N, the greater is the accuracy). A channel or a sub-channel increment can be performed through the regular N bits adressing bus of the main look-up table 257, after addition to the modulation N bits result, in order to vary slightly if needed, the centre of the reference frequency Fr, and consequently, the centre vlaue of the modulated output signal Rfout. The operation of the DDS is well known in the art.

The main synthesizer 252 comprises a phase detector 256, a loop filter 258, voltage controlled oscillator (VCO) 260 and a fixed divider 263 arranged in a typical phase-locked loop (PLL) arrangement.

The operation of the main synthesizer 252 is the same as described above with reference to FIG. 3. Like components to those of FIG. 3 are reference by the same reference numeral plus the number one hundred.

The basic principle of operation of the frequency modulator in accordance with the present invention is to apply the modulation data signal to the VCO of the main synthesizer and also to the reference signal with a correct level balance between the two paths.

Figure 5:
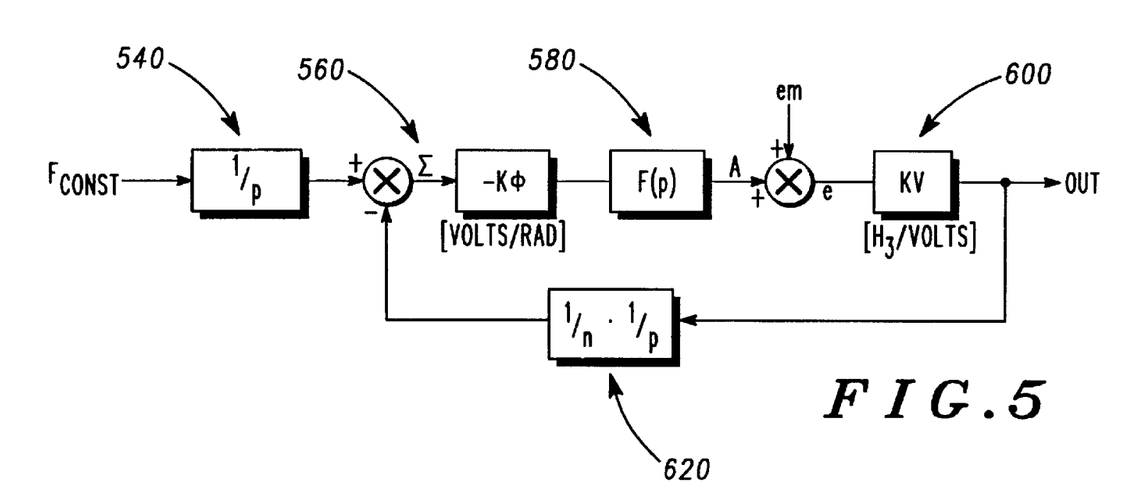
FIG. 5 is a schematic diagram showing the frequency components of a PLL loop in which the VCO is modulated.
Figure 6:
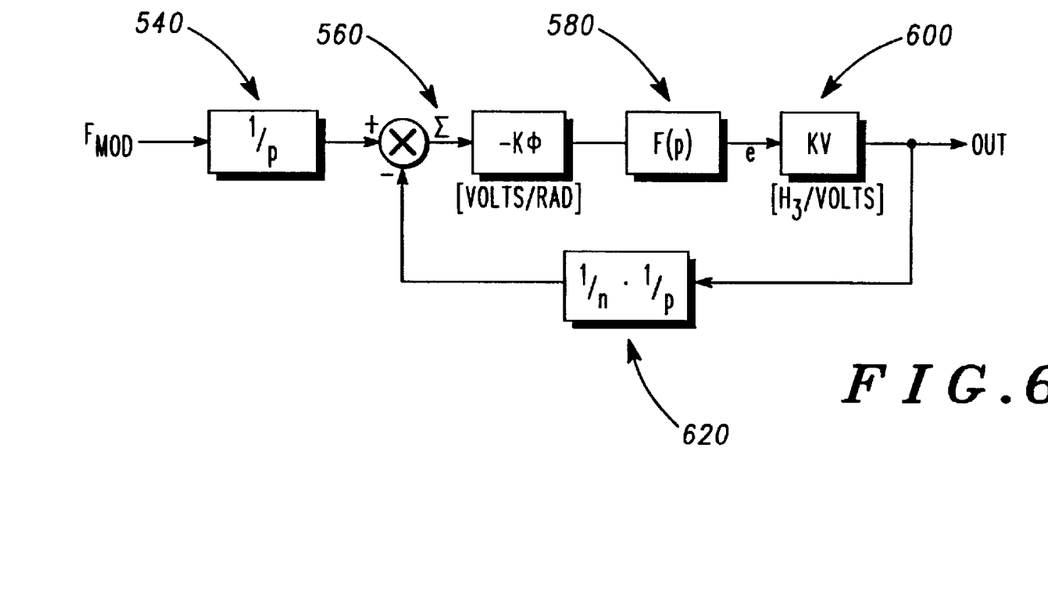
FIG. 6 is a schematic diagram showing the frequency components of a PLL loop in which the reference signal is modulated.
Figure 7:
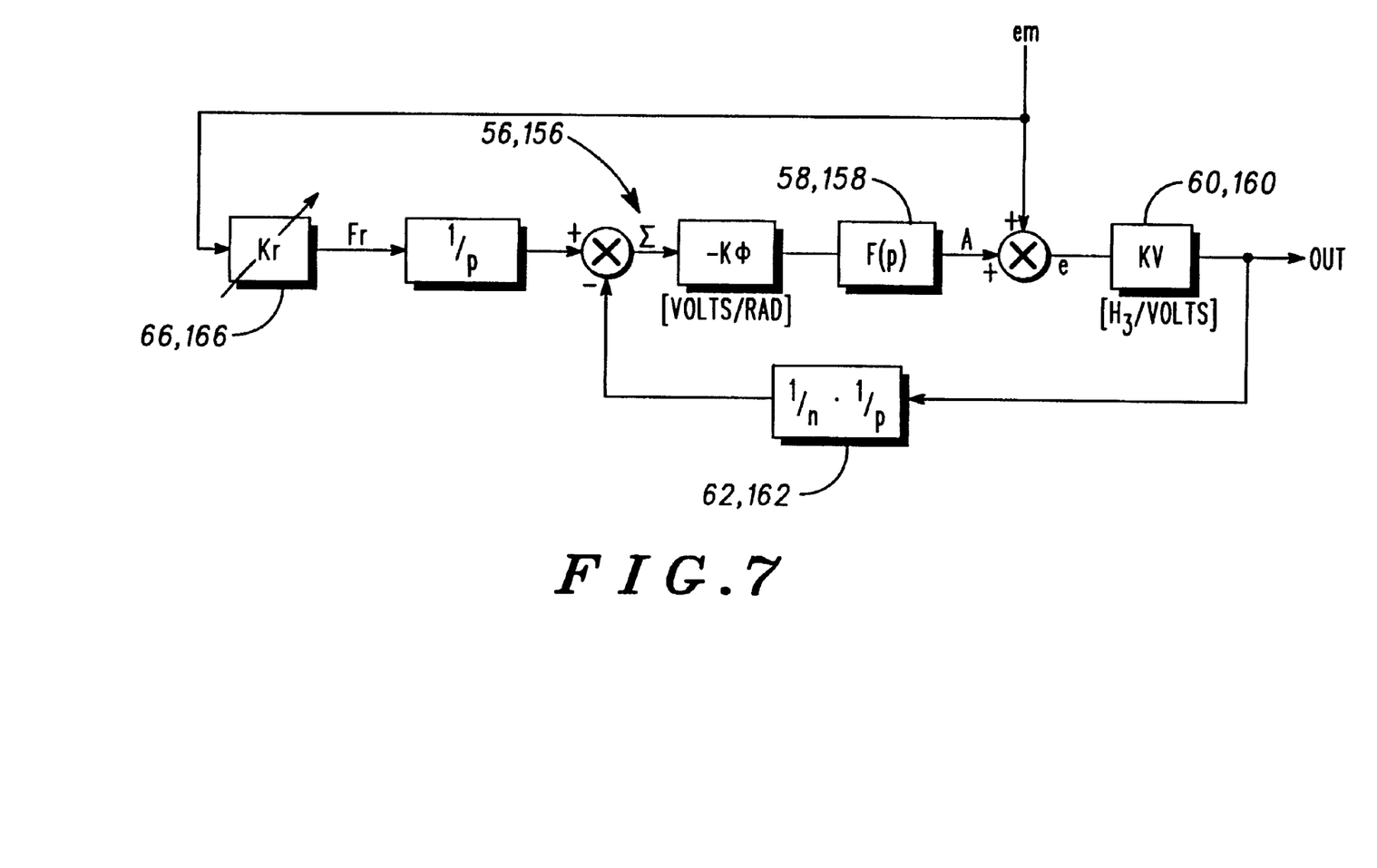
FIG. 7 is a schematic diagram showing the frequency components of a PLL loop in which the VCO and the reference signal is modulated by the modulation data signal in accordance with the present invention.

In order to understand completely this basic principle, a theoretical analysis will now be given with reference to FIGS. 5–7. FIG. 5 is a schematic diagram showing the frequency components of a PLL loop in which the VCO is modulated only, FIG. 6 is a schematic diagram showing the frequency components of a PLL loop in which the reference signal is modulated only and FIG. 7 is a schematic diagram showing the frequency components of the PLL loop in which the VCO and the reference signal is modulated by the modulation data signal in accordance with the present invention.

Referring firstly to FIG. 5, the voltage signal e which is applied to the varicap diode of a VCO 600 to generate a modulated output signal OUT is given by the following equation:

$$e = A + em = \frac{e(KV*K\emptyset*F(p))}{np} + em \quad (1)$$

where em is the modulation data signal

Fconst is a constant reference signal

KV is the modulation gain of the VCO 600 in Hz per Volts

KØ is the gain of the phase detector 560 in Volts per Radians

F(p) is the transfer function of the loop filter 580 (low pass filter)

n is the divide ratio of the variable divider 620

From equation 1, the transfer function for the modulation on the VCO loop is:

$$\frac{e}{em} = \frac{1}{1 - \frac{(KV*K\emptyset*F(p))}{np}} \quad (2)$$

This transfer function represents a high pass behaviour.

Referring now also to FIG. 6, for a modulated reference signal Fmod, the error signal Σ at the output of a phase detector 560 is given by the following equation:

$$\Sigma = \frac{Fmod}{p} - e\frac{KV}{np} \quad (3)$$

The voltage signal e is given by:

$$e = -K\emptyset*F(p)*\Sigma \quad (4)$$

By combining equations (3) and (4), the transfer function for the modulation on the reference signal loop is:

$$\frac{e}{Fmod} = \frac{n*K\emptyset*F(p)}{(K\emptyset*F(p)*KV) - np} \quad (5)$$

This represents a low pass behaviour.

Referring now to FIG. 7, the voltage signal e which is applied to the varicap diode of the VCO 160 of FIG. 3 or the VCO 260 of FIG. 4 to generate the modulated output signal RFout is given by the following equation:

$$e = em - K\emptyset*F(p)*\Sigma \quad (6)$$

Since the error signal Σ at the output of a phase detector 56 is:

$$\Sigma = em\frac{Kr}{p} - e\frac{KV}{np} \quad (7)$$

where em is the modulation data signal

Fr is the modulated reference signal

KV is the modulation gain of the VCO 60, 160 in Hz per Volts

KØ is the gain of the phase detector 56, 156 in Volts per Radians

F(p) is the transfer function of the loop filter 58, 158 (low pass filter)

n is the divide ratio of the variable divider 62, 162

Kr is the first modulation gain of the modulated reference signal Fr

By substituting equation (7) in equation (6), then:

$$\frac{e}{em} = \frac{1 - \frac{(Kr*K\emptyset*F(p))}{p}}{1 - \frac{(KV*K\emptyset*F(p))}{np}} \quad (8)$$

From equation (8), $$\text{when } Kr = \frac{KV}{n}, \text{ then } \frac{e}{em} = 1$$

Thus, from the above theoretical analysis when the first modulation gain Kr of the modulated reference signal Fr is equal to the modulation gain KV of the VCO of the main synthesizer divided by n, there is no low pass and high pass behaviour. In practice, it has been found that substantially the same effect can be achieved when the first modulation gain Kr of the modulated reference signal Fr is close to the modulation gain KV of the VCO of the main synthesizer divided by n; that is, when the first modulation gain Kr of the modulated reference signal Fr is proportional to the modulation gain KV.

Though the first modulation gain Kr is adjusted with the selectable value n and hence with the carrier frequency, the system is broadband enough to require only one trimming point within a 100 Mhz bandwidth or more at 2 GHz.

As mentioned above, the principle of operation of the frequency modulator in accordance with the present invention is to apply the modulation data signal to the VCO of the main synthesizer and also to the reference signal with a correct level balance between the two paths. Correct balance occurs when the values of the modulation gains Kr and KV are selected so that the first modulation gain Kr of the modulated reference signal Fr is substantially proportional to the modulation gain KV of the VCO. This results in the modulated output signal RFout having a response which is flat in amplitude and group delay, and independent of modulating frequency.

For the first frequency modulator 150, it is also necessary to ensure that the bandwidth of the auxiliary synthesizer 155 is substantially less than the bandwidth of the main synthesizer 152 or in other words, that the lock-up time of the auxiliary synthesizer 155 is substantially greater than that of the main synthesizer 152. The reference signal generator 154 then performs a low frequency modulation process, and the VCO of a main synthesizer 152 is involved in the high frequency modulation process with a result that the combination covers the whole bandwidth of the modulation data signal. Since the low frequency components of the modulation data signal modulate the reference signals, these components are not lost in the main synthesizer's PLL loop as they would be if only the main VCO was modulated. These low frequency components are then combined with the high frequency components of the modulation data signal which components are outside the bandwidth of the main synthesizer loop so as to provide the modulated output signal.

By utilising an auxiliary synthesizer 154 having a greater lock-up time than the main synthesizer 152 and by modulating the auxiliary VCO 170 by the modulation data signal, the main synthesizer 152 can be fast enough to be used as a channel selector and meet the lock-up time specification as required for the high frequency components.

Thus, from the above analysis it is clear that by modulating the reference signal supplied to the main synthesizer and the VCO of the main synthesizer with the modulation data signal, the present invention ensures that the modulation is independent of the speed of the main synthesizer. This means that the low frequency components of the modulation data signal are not lost nor is the speed of the main synthesizer compromised. Moreover, since the present invention ensures that the modulation is independent of the speed of the main synthesizer, there is substantially no limitation on the speed for the channel selection.

Since the present invention applies the modulation data signal directly to the main VCO 160, 260 which is coupled to the antenna via a power amplifier but not via mixers or other noisy components as with the prior art systems, the present invention provides a low noise and direct synthesis process which means that filters and duplexers are no longer needed in the transmit path and a lower cost power amplifier can be used. This represents a drastic cost reduction compared to known digital systems, some of which are described above in the introduction.

An additional advantage of the frequency modulator in accordance with the present invention, as can be seen from the first 150 and second 250 frequency modulators described above, is that it can be realised with low cost component blocks.

A further advantage is that the main synthesizer is always locked which means that every slot can be used in TDMA systems allowing data transmission or real range improvement.

Since the present invention ensures that the speed of the main synthesizer of the frequency modulator is optimised, the same main synthesizer can be used for the receive path RX in a transceiver. As mentioned above, such an arrangement avoids the need for an additional synthesizer in the receive path.

Although the present invention has been described above with reference to digital radio communication devices, the principle of the present invention could also be applied to analog radio communication devices.

What is claimed is:

1. A frequency modulator for modulating a carrier signal according to a modulation data signal to provide a modulated output signal, the frequency modulator comprising:

a reference signal generator coupled to receive the modulation data signal for generating a reference signal modulated according to the modulation data signal; and a main synthesizer coupled to receive the modulated reference signal and the modulation data signal for providing the modulated output signal at an output, and wherein the reference signal generator comprises an auxiliary synthesizer for performing a low frequency modulation process and having a lock-up time which is substantially greater than that of the main synthesizer, the auxiliary synthesizer comprising:

an auxiliary phase detector having a first input for receiving a fixed reference signal having a fixed frequency, a second input and an output for providing an error signal representing the difference in phase between the fixed reference signal and a signal at the second input; and an auxiliary VCO coupled to receive the error signal and the modulation data signal for generating the modulated reference signal at an output, the output of the auxiliary VCO being coupled to the main synthesizer and to the second input of the auxiliary phase detector.

2. A frequency modulator according to claim 1 wherein the main synthesizer for generating the modulated output signal and for controlling the frequency of the carrier signal, comprises:

a phase detector having a first input for receiving the modulated reference signal, a second input and an output for providing an error signal representing the difference in phase between the modulated reference signal and a signal at the second input;

a VCO coupled to receive the error signal and the modulation data signal for generating the modulated output signal at an output of the VCO; and a variable divider coupled between the output of the VCO and the second input of the phase detector for dividing the modulated output signal by a selectable value so as to vary the frequency of the carrier signal.

3. A frequency modulator according to claim 2 wherein the modulated reference signal has a first modulation gain and the modulated output signal has a modulation gain and wherein the first modulation gain is substantially equal to the gain of the modulated output signal divided by the selectable value of the variable divider.

4. A frequency modulator according to claim 2, wherein the VCO comprises a varicap tuning diode, the modulation data signal and the error signal being applied to the varicap tuning diode.

5. A frequency modulator according to claim 2, wherein the VCO comprises a varicap tuning diode and a varicap modulating diode, the modulation data signal being applied to the varicap modulating diode and the error signal being applied to the varicap tuning diode.

6. A frequency modulator according to claim 1 wherein the modulated reference signal has a first modulation gain and the modulated output signal has a modulation gain which is substantially proportional to the first modulation gain.

7. A frequency modulator according to claim 6 wherein the gain of the modulated output signal is adjustable.

8. A frequency modulator according to claim 6 further comprising an attenuator coupled between an input for receiving the modulation data signal and the main sythesizer for adjusting the gain of the modulated output signal.

9. A frequency modulator according to claim 1 wherein the auxiliary synthesizer further comprises a divider coupled between the output of the auxiliary VCO and the second input of the auxiliary phase detector for dividing the modulated reference signal by a fixed value.

10. A frequency modulator according to claim 1 wherein the reference signal generator further comprises a variable gain control for controlling the first modulation gain of the modulated reference signal.

11. A frequency modulator for modulating a carrier signal according to a modulation data signal to provide a modulated output signal, the frequency modulator comprising:
   a reference signal generator coupled to receive the modulation data signal for generating a reference signal modulated according to the modulation data signal; and
   a main synthesizer coupled to receive the modulated reference signal and the modulation data signal for performing a high frequency modulation process and for providing the modulated output signal at an output, and wherein the reference signal generator comprises a direct digital synthesizer for performing a low frequency modulation process and having an input for receiving the modulation data signal and an output for providing the modulated reference signal, the modulated reference signal having a frequency which is dependent on a channel select signal.

12. A transmitter for a digital radio communication device having a transmit path comprising:
   a frequency modulator for modulating a carrier signal according to a modulation data signal to provide a modulated output signal, the frequency modulator comprising:
      a reference signal generator coupled to receive the modulation data signal for generating a reference signal modulated according to the modulation data signal; and
      a main synthesizer coupled to receive the modulated reference signal and the modulation data signal for performing a high frequency modulation process and for providing the modulated output signal at an output, and wherein the reference signal generator comprises an auxiliary synthesizer for performing a low frequency modulation process and having a lock-up time which is substantially greater than that of the main synthesizer, the auxiliary synthesizer comprising:
         an auxiliary phase detector having a first input for receiving a fixed reference signal having a fixed frequency, a second input and an output for providing an error signal representing the difference in phase between the fixed reference signal and a signal at the second input; and
         an auxiliary VCO coupled to receive the error signal and the modulation data signal for generating the modulated reference signal at an output, the output of the auxiliary VCO being coupled to the main synthesizer and to the second input of the auxiliary phase detector;
   a power amplifier for amplifying the modulated output signal; and
   an antenna coupled to the power amplifier.

13. A frequency modulator according to claim 12 wherein the main synthesizer for generating the modulated output signal and for controlling the frequency of the carrier signal, comprises:
   a phase detector having a first input for receiving the modulated reference signal, a second input and an output for providing an error signal representing the difference in phase between the modulated reference signal and a signal at the second input;
   a VCO coupled to receive the error signal and the modulation data signal for generating the modulated output signal at an output of the VCO; and
   a variable divider coupled between the output of the VCO and the second input of the phase detector for dividing the modulated output signal by a selectable value so as to vary the frequency of the carrier signal.

14. A frequency modulator according to claim 13 wherein the modulated reference signal has a first modulation gain and the modulated output signal has a modulation gain and wherein the first modulation gain is substantially equal to the gain of the modulated output signal divided by the selectable value of the variable divider.

15. A frequency modulator according to claim 13, wherein the VCO comprises a varicap tuning diode, the modulation data signal and the error signal being applied to the varicap tuning diode.

16. A frequency modulator according to claim 13, wherein the VCO comprises a varicap tuning diode and a varicap modulating diode, the modulation data signal being applied to the varicap modulating diode and the error signal being applied to the varicap tuning diode.

17. A frequency modulator according to claim 12 wherein the modulated reference signal has a first modulation gain and the modulated output signal has a modulation gain which is substantially proportional to the first modulation gain.

18. A frequency modulator according to claim 17 wherein the gain of the modulated output signal is adjustable.

19. A frequency modulator according to claim 17 further comprising an attenuator coupled between an input for receiving the modulation data signal and the main synthesizer for adjusting the gain of the modulated output signal.

20. A transceiver for a digital radio communication device having a transmit path and a receive path, the transmit path comprising:
   a frequency modulator for modulating a carrier signal according to a modulation data signal to provide a modulated output signal, the frequency modulator comprising:
      a reference signal generator coupled to receive the modulation data signal for generating a reference signal modulated according to the modulation data signal; and a main synthesizer coupled to receive the modulated reference signal and the modulation data signal for performing a high frequency modulation process and for providing the modulated output signal at an output, and wherein the reference signal generator comprises an auxiliary synthesizer for performing a low frequency modulation process and having a lock-up time which is substantially greater than that of the main synthesizer, the auxiliary synthesizer comprising:

an auxiliary phase detector having a first input for receiving a fixed reference signal having a fixed frequency, a second input and an output for providing an error signal representing the difference in phase between the fixed reference signal and a signal at the second input; and an auxiliary VCO coupled to receive the error signal and the modulation data signal for generating the modulated reference signal at an output, the output of the auxiliary VCO being coupled to the main synthesizer and to the second input of the auxiliary phase detector;

a power amplifier for amplifying the modulated output signal; and an antenna for coupling to the power amplifier.

21. A transmitter for a digital radio communication device having a transmit path comprising:

a frequency modulator for modulating a carrier signal according to a modulation data signal to provide a modulated output signal, the frequency modulator comprising:

a reference signal generator coupled to receive the modulation data signal for generating a reference signal modulated according to the modulation data signal; and a main synthesizer coupled to receive the modulated reference signal and the modulation data signal for performing a high frequency modulation process and for providing the modulated output signal at an output, and wherein the reference signal generator comprises a direct digital synthesizer for performing a low frequency modulation process and having an input for receiving the modulation data signal and an output for providing the modulated reference signal, the modulated reference signal having a frequency which is dependent on a channel select signal; and a power amplifier for amplifying the modulated output signal; and an antenna coupled to the power amplifier.

\* \* \* \* \*

UNITED STATES PATENT AND TRADEMARK OFFICE
CERTIFICATE OF CORRECTION

PATENT NO.    : 6,345,173 B1
DATED         : February 5, 2002
INVENTOR(S)   : Christophe Fourtet et al.

It is certified that error appears in the above-identified patent and that said Letters Patent is hereby corrected as shown below:

<u>Title page, Item [54] and Column 1, line 2,</u>
After "MODULATOR" add -- , TRANSMITTER AND TRANSCEIVER INCORPORATING A FREQUENCY MODULATOR --

<u>Column 10,</u>
Line 30, after "data signal" add -- for performing a high frequency modulation process and --

Signed and Sealed this

Eleventh Day of February, 2003

JAMES E. ROGAN
*Director of the United States Patent and Trademark Office*